(12) United States Patent
Yu et al.

(10) Patent No.: US 10,971,583 B2
(45) Date of Patent: Apr. 6, 2021

(54) GATE CUT ISOLATION INCLUDING AIR GAP, INTEGRATED CIRCUIT INCLUDING SAME AND RELATED METHOD

(71) Applicant: GLOBALFOUNDRIES U.S. Inc., Santa Clara, CA (US)

(72) Inventors: Hong Yu, Rexford, NY (US); Hui Zang, Guilderland, NY (US); Jiehui Shu, Clifton Park, NY (US)

(73) Assignee: GLOBALFOUNDRIES U.S. INC., Santa Clara, CA (US)

( * ) Notice: Subject to any disclaimer, the term of this patent is extended or adjusted under 35 U.S.C. 154(b) by 53 days.

(21) Appl. No.: 16/188,408

(22) Filed: Nov. 13, 2018

(65) Prior Publication Data

US 2020/0152736 A1 May 14, 2020

(51) Int. Cl.
| | | |
|---|---|---|
| *H01L 29/06* | (2006.01) | |
| *H01L 29/66* | (2006.01) | |
| *H01L 29/78* | (2006.01) | |
| *H01L 27/088* | (2006.01) | |
| *H01L 21/033* | (2006.01) | |
| *H01L 21/8234* | (2006.01) | |
| *H01L 21/764* | (2006.01) | |
| *H01L 21/768* | (2006.01) | |

(52) U.S. Cl.
CPC ...... *H01L 29/0649* (2013.01); *H01L 21/0337* (2013.01); *H01L 21/764* (2013.01); *H01L 21/76831* (2013.01); *H01L 21/823431* (2013.01); *H01L 21/823437* (2013.01); *H01L 21/823481* (2013.01); *H01L 27/0886* (2013.01); *H01L 29/66545* (2013.01); *H01L 29/7851* (2013.01)

(58) Field of Classification Search
CPC ............ H01L 29/0649; H01L 21/0337; H01L 21/764; H01L 21/76831; H01L 21/823431; H01L 21/823437; H01L 21/823481; H01L 27/0886; H01L 29/66545; H01L 29/7851
USPC ........................................................ 257/368
See application file for complete search history.

(56) References Cited

U.S. PATENT DOCUMENTS

| | | |
|---|---|---|
| 8,846,491 B1 | 9/2014 | Pham et al. |
| 2014/0024192 A1* | 1/2014 | Kim ...................... H01L 29/165 438/296 |
| 2016/0190130 A1 | 6/2016 | Yu et al. |

\* cited by examiner

*Primary Examiner* — Hrayr A Sayadian
(74) *Attorney, Agent, or Firm* — Francois Pagette; Hoffman Warnick LLC (57) ABSTRACT

A gate cut isolation including an air gap and an IC including the same are disclosed. A method of forming the gate cut isolation may include forming an opening in a dummy gate that extends over a plurality of spaced active regions, the opening positioned between and spaced from a pair of active regions. The opening is filled with a fill material, and the dummy gate is removed. A metal gate is formed in a space vacated by the dummy gate on each side of the fill material, and the fill material is removed to form a preliminary gate cut opening. A liner is deposited in the preliminary gate cut opening, creating a gate cut isolation opening, which is then sealed by depositing a sealing layer. The sealing layer closes an upper end of the gate cut isolation opening and forms the gate cut isolation including an air gap.

9 Claims, 9 Drawing Sheets

GATE CUT ISOLATION INCLUDING AIR GAP, INTEGRATED CIRCUIT INCLUDING SAME AND RELATED METHOD

BACKGROUND

The present disclosure relates to integrated circuit (IC) fabrication, and more specifically, to a gate cut isolation including an air gap, an IC including the same and a method of forming the gate cut isolation.

Advanced manufacturing of ICs requires formation of individual circuit elements, e.g., field-effect-transistors (FETs) and the like, based on specific circuit designs. A FET generally includes source, drain, and gate regions. The gate region is placed between the source and drain regions and controls the current through a channel region (often shaped as a semiconductor fin) between the source and drain regions. Gates may be composed of various metals and often include a work function metal which is chosen to create desired characteristics of the FET. Transistors may be formed over a substrate and may be electrically isolated with an insulating dielectric layer, e.g., inter-level dielectric (ILD) layer. Contacts may be formed to each of the source, drain, and gate regions through the dielectric layer in order to provide electrical connection between the transistors and other circuit elements that may be formed subsequent to the transistor in other metal levels.

Fin-type field effect transistor (finFETs) are formed by creating a number of semiconductor fins on a substrate and placing a gate conductor perpendicularly across the fins. A finFET is created by the gate forming a channel region below the gate in the fin, and source/drain regions formed in the fin aside the gate. In order to form the various portions of the finFET according to replacement metal gate (RMG) approach, an elongated dummy gate is put in place where the metal gate conductor will eventually be placed perpendicularly across the fins. The dummy gate allows for processing such as anneals to be carried out without damaging the final gate conductor material. Spaces between the dummy gates and fins are filled with an interlayer dielectric. The dummy gates are typically made of polysilicon or amorphous silicon with a liner spacer such as titanium nitride. As part of the process, a gate cut opening is formed in the dummy gate, and is then filled with a gate cut fill. To form the finFETs, the dummy gate is removed, and replaced with a metal gate conductor that extends over adjacent fins. The gate cut fill creates a gate cut isolation that provides an electrical isolation between gates of adjacent finFETs to electrically isolate the finFETs.

As integrated circuit (IC) fabrication continues to scale to smaller technology nodes, e.g., 7 nanometers and beyond, spacing between structures continues to decrease. For example, ground rules and pattern variability lead to extremely tight spacing for gate cut openings during finFET formation. A particular challenge with forming the gate cut is creating the opening with the desired size. For example, the width for a gate cut opening is typically about 30 nanometers (nm), which allows sufficient space to remove any residue from the opening. However, that size is becoming too large for 7 nm technology node finFETs. That is, the gate cut fill size needs to be smaller than 30 nm to provide sufficient spacing, and to ensure metal gate conductor separation after metal conductor replacement in a 7 nm technology node. More specifically, in the 7 nm technology node, the amorphous silicon and liner spacer pinch off in a narrow gate cut, making it very difficult to remove the amorphous silicon residue at the bottom of the opening with the conventional reactive ion etch (RIE). In one approach, a high bias power RIE overetch is applied, but this etch creates bowed sidewalls in the gate cut opening, which can create shorts with the gate conductor ends. A larger gate cut isolation dimension reduces the process margin in a way that may cause a void in the subsequent gate formation, e.g., formation of a work function metal layer of the gate.

SUMMARY

A first aspect of the disclosure is directed to a method, comprising: forming an opening in a dummy gate that extends over a plurality of spaced active regions, the opening positioned between and spaced from a pair of the active regions; filling the opening with a fill material; removing the dummy gate, leaving the fill material; forming a metal gate to each side of the fill material by forming a work function metal and a metal gate material in a space vacated by the dummy gate; removing the fill material from the gate, forming a preliminary gate cut opening; recessing the metal gate; depositing a liner in the preliminary gate cut opening, creating a gate cut isolation opening; and depositing a sealing layer, closing an upper end of the gate cut isolation opening and forming a gate cut isolation including an air gap.

A second aspect of the disclosure includes a gate cut isolation between ends of two gate conductors, the gate conductors over active regions of a substrate, the gate cut isolation comprising: a liner covering sidewalls and a bottom portion of an opening between the ends of the gate conductors; and a sealing layer over the opening closing an upper end of the opening, creating an air gap in the opening.

A third aspect of the disclosure is related to an integrated circuit (IC), comprising: a plurality of spaced first and second active regions extending from a substrate; a first gate extending over the first active region; a second gate extending over the second active region; and a gate cut isolation separating the first gate from the second gate, the gate cut isolation including: an opening between the first gate and the second gate, a liner extending along a bottom portion and sidewalls of the opening, and a sealing layer over the opening closing an upper end of the opening, creating an air gap.

The foregoing and other features of the disclosure will be apparent from the following more particular description of embodiments of the disclosure.

BRIEF DESCRIPTION OF THE DRAWINGS

The embodiments of this disclosure will be described in detail, with reference to the following figures, wherein like designations denote like elements, and wherein.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

A gate cut isolation including an air gap and an IC including the same are disclosed. As will be described, a method of forming the gate cut isolation may include forming an opening in a dummy gate that extends over first and active regions (e.g., perpendicularly over one or more plurality of spaced semiconductor fins), the opening positioned between and spaced from a pair of the active regions, e.g., semiconductor fins. The opening is filled with a fill material, and the dummy gate is removed. The fill material may be trimmed to a desired size. A metal gate is formed in a space vacated by the dummy gate on each side of the fill material, and the fill material is removed from the gate to form a preliminary gate cut opening. A liner is deposited in the preliminary gate cut opening, creating a gate cut isolation opening. The liner sizes the gate cut isolation, e.g., to allow for sealing. The gate cut isolation opening is then sealed by depositing a sealing layer. The sealing layer closes an upper end of the gate cut isolation opening and forms the gate cut isolation including an air gap. The air gap formation allows for creation of smaller spacing relative to the ends of the gate conductors, and prevents problems associated with conventional processing such as over etching leading to shorts, improper formation of work function metals, etc. In addition, the air gap provides a higher dielectric constant than conventional gate cut isolation dielectric materials.

Figure 1:
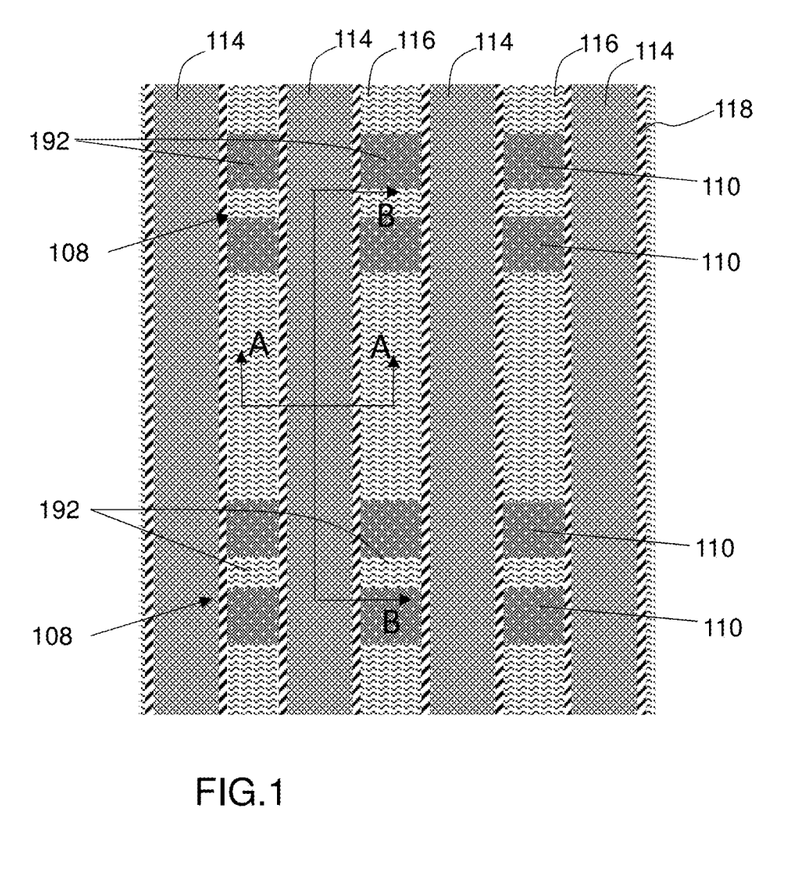
FIG. 1 shows a schematic plan view of an integrated circuit layout indicating cross-sectional views for purposes of description of the disclosure. Subsequent drawings with an 'A' indicator show a cross-sectional view along line A-A across a gate direction in FIG. 1, and subsequent drawings with a 'B' indicator show a cross-sectional view along line B-B across an active region, e.g., fin, direction in FIG. 1.

FIG. 1 shows a schematic plan view of an integrated circuit layout indicating cross-sectional views for purposes of description of the disclosure. In the subsequent drawings, those with an 'A' indicator show a cross-sectional view along line A-A across a gate direction in FIG. 1, and those with a 'B' indicator show a cross-sectional view along line B-B across an active region, e.g., fin, direction in FIG. 1. The disclosure is shown applied to a fin-type active region arrangement, but it is emphasized as one with skill in the art will recognize, that the teachings are applicable to any type active region including but not limited to planar, semiconductor-on-insulator, etc.

Figure 2A:
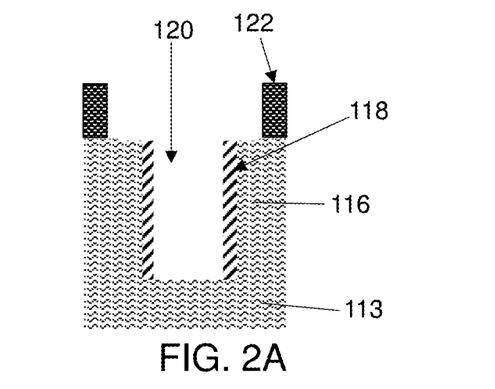
FIGS. 2A-B show cross-sectional views of forming an opening in a dummy gate according to embodiments of the disclosure.
Figure 2B:
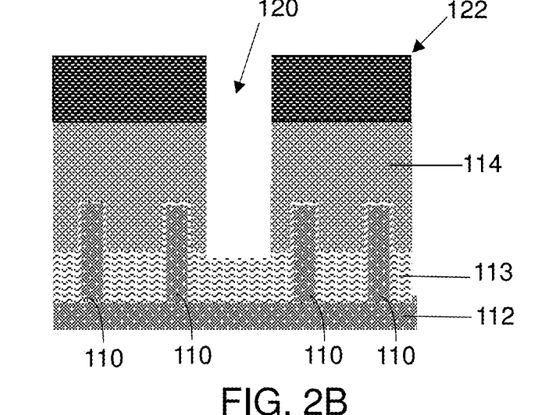

With reference to FIGS. 1 and 2A-B, active regions 108 are shown in the form of a plurality of semiconductor fins 110. Plurality of semiconductor fins 110 have been formed extending from a substrate 112. Active regions 108, semiconductor fins 110 and substrate 112 may include but are not limited to silicon, germanium, silicon germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). Furthermore, a portion or entire semiconductor substrate 112 may be strained. Active regions, e.g., semiconductor fins 110, may be electrically isolated from each other by a shallow isolation trench (STI) dielectric layer 113 in a known fashion.

FIGS. 1 and 2B also show a dummy gate 114 formed over the active regions, e.g., perpendicularly over semiconductor fins 110. Dummy gate 114 may include any now known or later developed dummy gate material such as but not limited to polysilicon and amorphous silicon. As shown in FIGS. 1 and 2A, spacer 118 may be provided along sides of dummy gate 114. Spacer 118 may include any now known or later developed spacer material such as but not limited to titanium nitride (TiN), silicon nitride ($Si_3N_4$), etc.

An interlayer dielectric (ILD) 116 may electrically isolate an upper portion of the active regions, e.g., semiconductor fins 110, and dummy gates 114. Suitable dielectric materials for ILD 116 and/or STI dielectric layer 113 may include but are not limited to: carbon-doped silicon dioxide materials; fluorinated silicate glass (FSG); organic polymeric thermoset materials; silicon oxycarbide; SiCOH dielectrics; fluorine doped silicon oxide; spin-on glasses; silsesquioxanes, including hydrogen silsesquioxane (HSQ), methyl silsesquioxane (MSQ) and mixtures or copolymers of HSQ and MSQ; benzocyclobutene (BCB)-based polymer dielectrics, and any silicon-containing low-k dielectric. Examples of spin-on low-k films with SiCOH-type composition using silsesquioxane chemistry include HOSP™ (available from Honeywell), JSR 5109 and 5108 (available from Japan Synthetic Rubber), Zirkon™ (available from Shipley Microelectronics, a division of Rohm and Haas), and porous low-k (ELk) materials (available from Applied Materials). Examples of carbon-doped silicon dioxide materials, or organosilanes, include Black Diamond™ (available from Applied Materials) and Coral™ (available from Lam Research). An example of an HSQ material is FOx™ (available from Dow Corning).

Source/drain (S/D) regions 192 may also be formed in active regions, e.g., semiconductor fins 110, to each side of dummy gate 114, e.g., by ion implantation of dopants, and/or S/D epitaxy, oxide deposition and polishing. Doping is the process of introducing impurities (dopants) into a semiconductor substrate, or elements formed on the semiconductor substrate, and is often performed with a mask (or previously-formed elements like the dummy gates in place) so that only certain areas of the active region, e.g., substrate/fins, will be doped. For example, doping is used to form the source and drain regions of a field effect transistor (FET). Epitaxy means the growth of a semiconductor material on a deposition surface of a semiconductor material, in which the semiconductor material being grown may have the same crystalline characteristics as the semiconductor material of the deposition surface.

The afore-described structure can be formed using any now known or later developed semiconductor fabrication techniques.

FIGS. 2A-B show cross-sectional views of forming an opening 120 in dummy gate 114, according to embodiments of the disclosure. As understood, each dummy gate 114 extends (perpendicularly) over the active region, e.g., plurality of spaced semiconductor fins 110. One or more dummy gates 114 for which a gate cut isolation will be desired for a metal gate subsequently formed in the position of the dummy gate may include a respective opening 120. That is, while one opening 120 is shown, any number of dummy gates 114 may include a respective opening 120. As shown in FIG. 2B, opening 120 is positioned between and spaced from active regions, e.g., a pair of the semiconductor fins 110. Opening 120 may be formed by depositing, patterning and etching a hard mask 122. In one example, hard mask 122 may include titanium oxide ($TiO_2$) or aluminum oxide ($Al_2O_3$). However, a wide variety of other hard mask materials are possible.

As used herein, "depositing" may include any now known or later developed techniques appropriate for the material to be deposited including but are not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

Figure 3A:
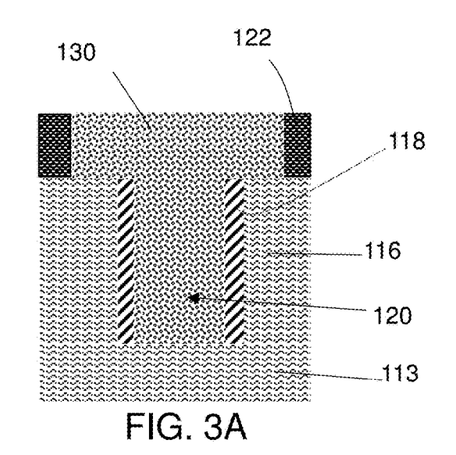
FIGS. 3A-B show cross-sectional views of filling the opening with fill material according to embodiments of the disclosure.
Figure 3B:
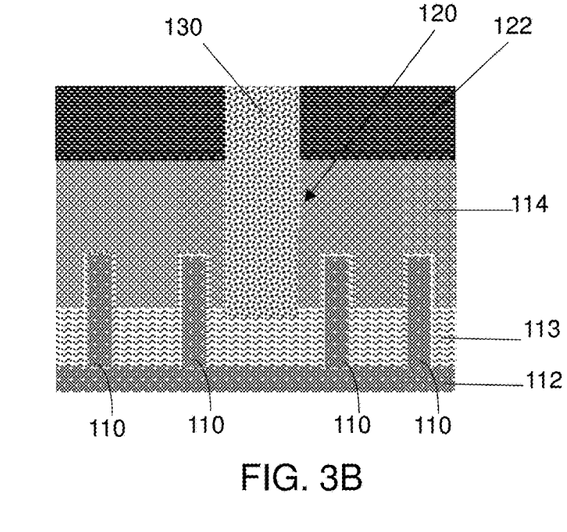

FIGS. 3A-B show cross-sectional views of filling opening 120 with fill material 130. Fill material 130 may include a material with a high etch selectivity to silicon, oxide and nitride. In one embodiment, fill material 130 may include germanium (Ge) or silicon germanium (SiGe). However, other sacrificial materials with the stated etch selectivity may be employed. Fill material 130 may be deposited using, for example, CVD. A planarization may be carried out to remove excess fill material 130 from over mask 122. Planarization refers to various processes that make a surface more planar (that is, more flat and/or smooth). Chemical-mechanical-polishing (CMP) is one currently conventional planarization process which planarizes surfaces with a combination of chemical reactions and mechanical forces.

Figure 4A:
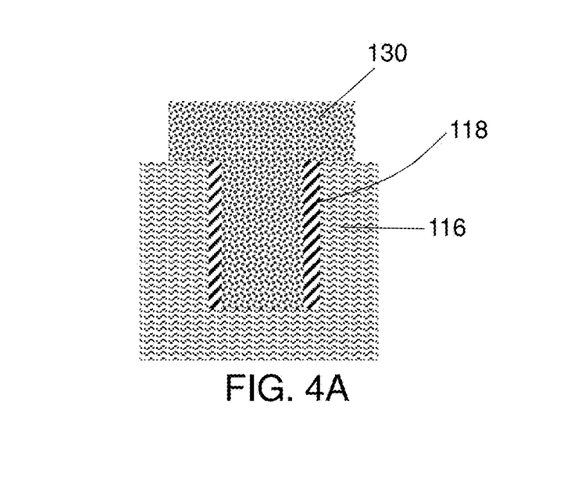
FIGS. 4A-B show cross-sectional views of removing a dummy gate according to embodiments of the disclosure.
Figure 4B:
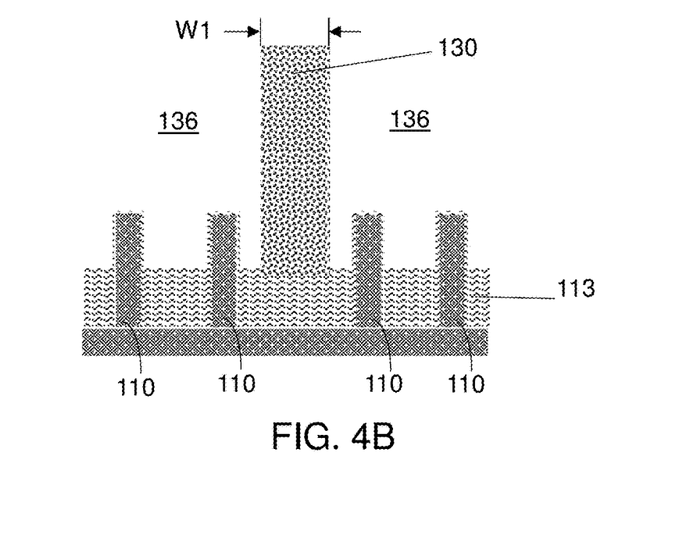

FIGS. 4A-B show cross-sectional views of removing dummy gate 114, leaving fill material 130. This step is commonly called "dummy gate pull." Dummy gate 114 may be removed using any now known or later developed process. In one example, dummy gate 114 is etched away. Etching generally refers to the removal of material from a substrate (or structures formed on the substrate), and is often performed with a mask in place so that material may selectively be removed from certain areas of the substrate, while leaving the material unaffected, in other areas of the substrate. There are generally two categories of etching, (i) wet etch and (ii) dry etch. Wet etch is performed with a solvent (such as an acid) which may be chosen for its ability to selectively dissolve a given material (such as oxide), while, leaving another material (such as polysilicon) relatively intact. This ability to selectively etch given materials is fundamental to many semiconductor fabrication processes. A wet etch will generally etch a homogeneous material (e.g., oxide) isotropically, but a wet etch may also etch single-crystal materials (e.g. silicon wafers) anisotropically. Dry etch may be performed using a plasma. Plasma systems can operate in several modes by adjusting the parameters of the plasma. Ordinary plasma etching produces energetic free radicals, neutrally charged, that react at the surface of the wafer. Since neutral particles attack the wafer from all angles, this process is isotropic. Ion milling, or sputter etching, bombards the wafer with energetic ions of noble gases which approach the wafer approximately from one direction, and therefore this process is highly anisotropic. Reactive-ion etching (RIE) operates under conditions intermediate between sputter and plasma etching and may be used to produce deep, narrow features, such as STI trenches. In this case, dummy gates 114 may be removed, for example, by RIE. It is understood that dummy gate 114 removal leaves trenches 136 (FIG. 4B) in ILD 116 on opposing sides of fill material 130—viewable in the B-B cross-section, but not the A-A cross-section. Mask 122 (FIGS. 3A-B) may be removed as part of the dummy gate removal, and/or thereafter.

Figure 5A:
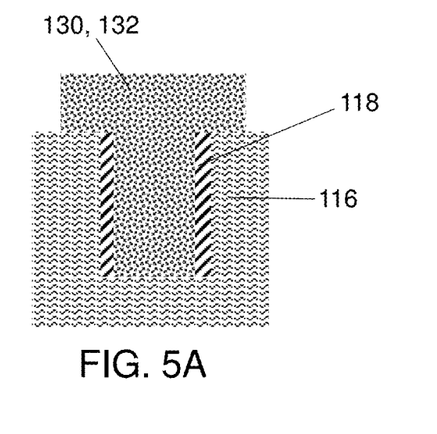
FIGS. 5A-B show cross-sectional views of optionally reducing a dimension of the fill material according to embodiments of the disclosure.
Figure 5B:
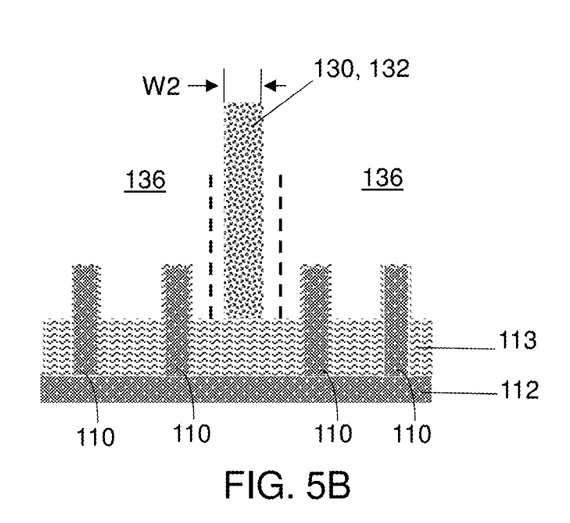

FIGS. 5A-B show cross-sectional views of optionally reducing a dimension of fill material 130, forming a specifically sized fill material pillar 132. For example, a width W1 (FIG. 4B) may be reduced to width W2 (FIG. 5B). This step may be referred to as "trimming." FIG. 5A shows the reduction in width of fill material 130 away from where dummy gate 114 (FIG. 3B) has been removed. As shown in FIG. 5B, the reduction in dimension of fill material 130 can be precisely controlled to create fill material pillar 132 having a desired dimension, e.g., width W2, configured to create a desired size gate cut isolation as further described herein. The reduction in dimension can include performing an etching such as a RIE, thus the reduction in dimension increases the width of trenches 136.

Figure 6A:
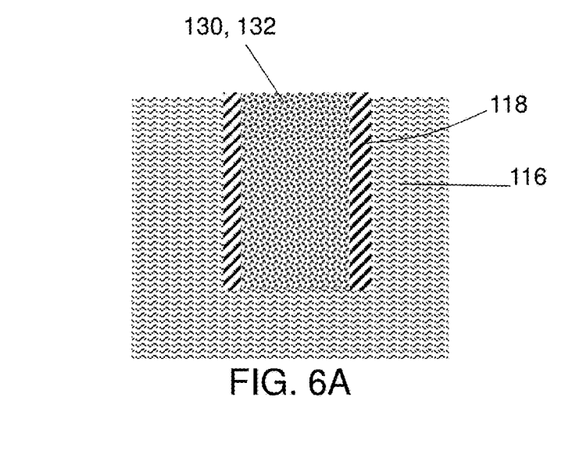
FIGS. 6A-B show cross-sectional views of forming metal gates about the fill material according to embodiments of the disclosure.
Figure 6B:
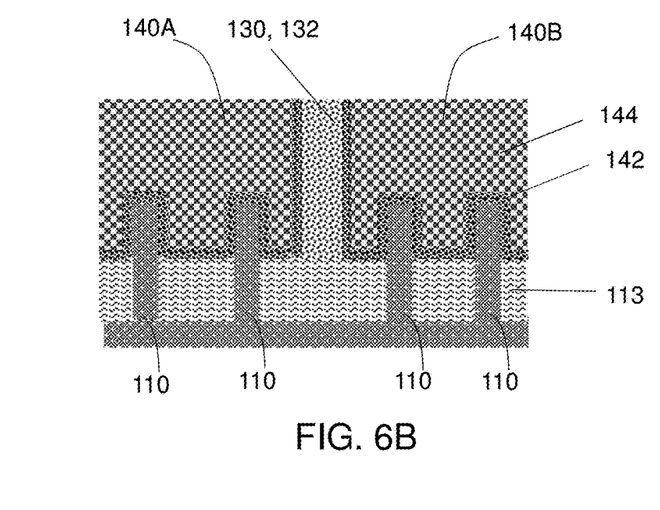

FIGS. 6A-B show cross-sectional views of forming a metal gate 140A, 140B to each side of fill material 130 by forming a work function metal 142 and a metal gate material 144 in a space, e.g., trenches 136 (FIG. 5B), vacated by dummy gate 114 (FIG. 3B). Metal gates 140A, 140B thus create gate conductors with ends thereof against fill material 130, i.e., fill material pillar 132, in trenches 136 (FIG. 5B). The work function is the minimum energy (usually measured in electron volts) needed to remove an electron from a solid to a point immediately outside the solid surface (or energy needed to move an electron from the Fermi energy level into vacuum). The work function is an important property of metals. The magnitude of the work function is usually about a half of the ionization energy of a free atom of the metal. Work function metals are selected to create a PFET or NFET. Work function metals may include, for example, aluminum (Al), zinc (Zn), indium (In), copper (Cu), indium copper (InCu), tin (Sn), tantalum (Ta), tantalum nitride (TaN), tantalum carbide (TaC), titanium (Ti), titanium nitride (TiN), titanium carbide (TiC), aluminum-doped titanium carbide (TiAlC), titanium aluminide (TiAl), tungsten (W), tungsten nitride (WN), tungsten carbide (WC), polycrystalline silicon (poly-Si), and/or combinations thereof. Metal gate material 144 may include any now known or later developed gate metal such as but not limited to tungsten (W). One or more planarization(s) may be performed to remove excess work function metal 142 or metal gate material 144.

Figure 7A:
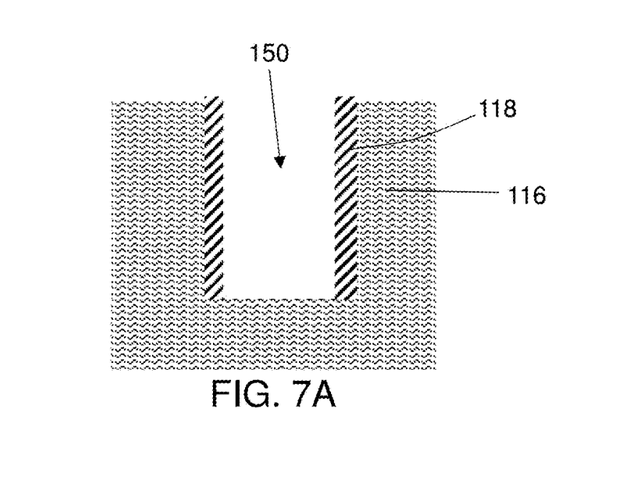
FIGS. 7A-B show cross-sectional views of removing the fill material, forming a preliminary gate cut opening according to embodiments of the disclosure.
Figure 7B:
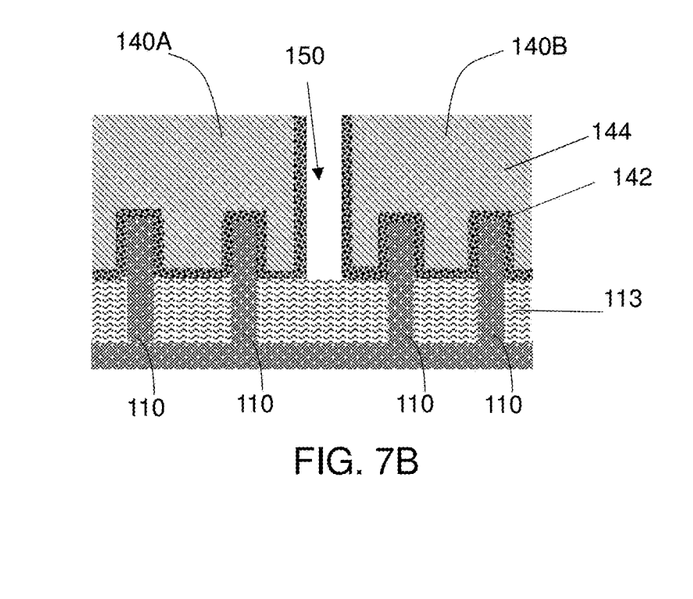

FIGS. 7A-B show cross-sectional views of removing fill material 130 (FIGS. 6A-B), i.e., fill material pillar 132 (FIGS. 6A-B), forming a preliminary gate cut opening 150. As can be appreciated, preliminary gate cute opening 150 has or is close to the same dimensions as fill material pillar 132, e.g., with width W2. Fill material 130 may be removed by, for example, a RIE.

Figure 8A:
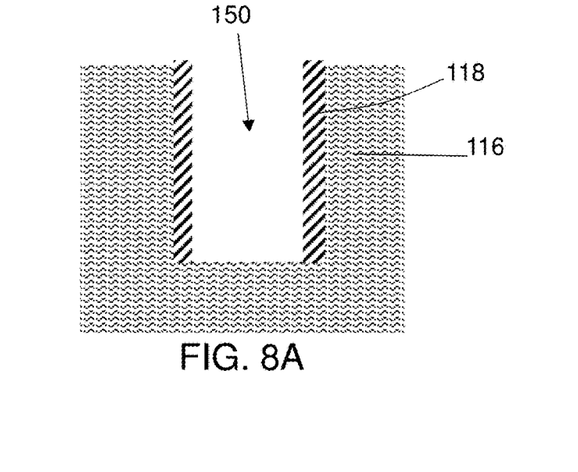
FIGS. 8A-B show cross-sectional views of optionally recessing the metal gates according to embodiments of the disclosure.
Figure 8B:
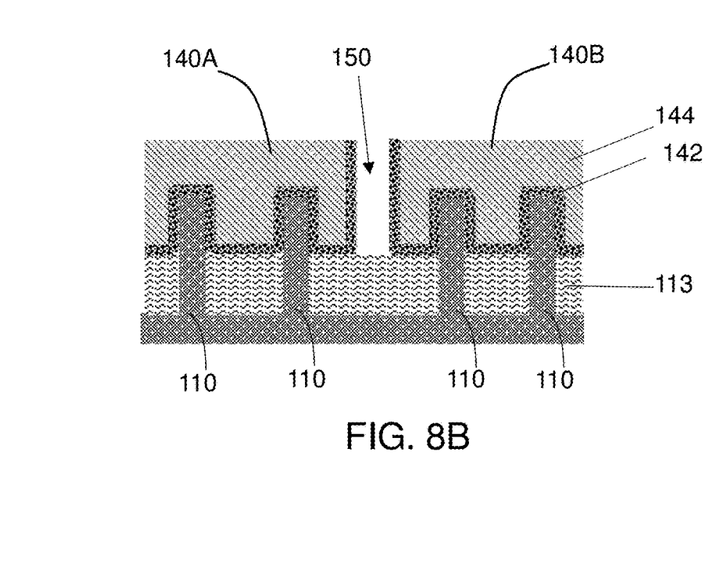

FIGS. 8A-B show cross-sectional views of optionally recessing metal gates 140A, 140B. In some cases, it is desirable or necessary to reduce a height of metal gates 140A, 140B, e.g., to accommodate desired dimensions, etc. The recessing may include any now known or later developed recessing process such as but not limited to etching and/or planarization.

Figure 9A:
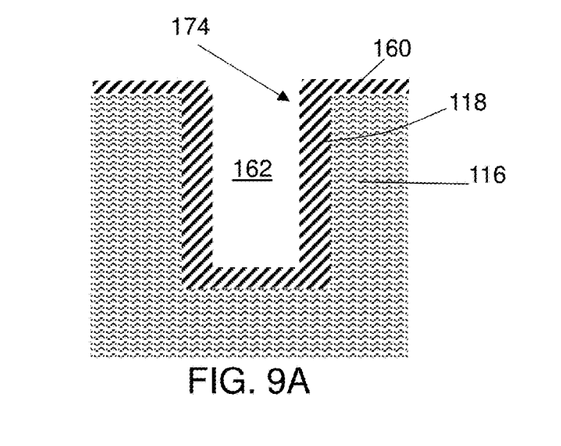
FIGS. 9A-B show cross-sectional views of forming a liner in the preliminary gate cut opening, forming a gate cut isolation opening according to embodiments of the disclosure.
Figure 9B:
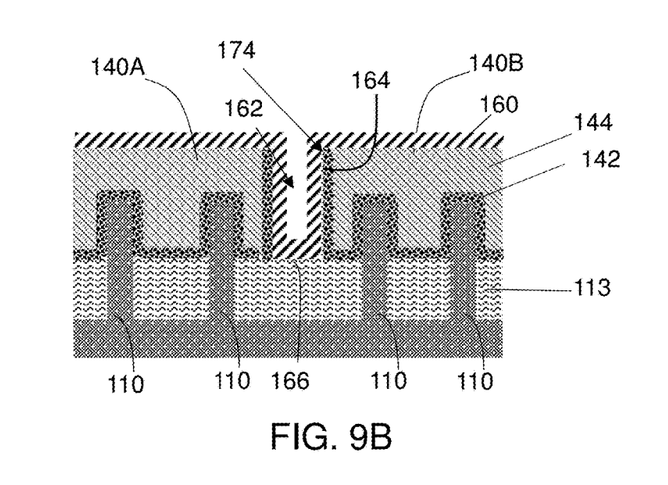

FIGS. 9A-B show cross-sectional views of forming a liner 160 in preliminary gate cut opening 150, forming a gate cut isolation opening 162. Liner 160 covers sidewalls 164 (FIG. 9B) and a bottom portion 166 (FIG. 9B) of gate cut isolation opening 162 between ends of gate conductors, i.e., metal gates 140A, 140B. As illustrated, liner 160 protects metal gate(s) 140A, 140B by covering exposed work function metal 142, and reduces a dimension of the preliminary gate cut opening 150 (FIGS. 8A-B). Liner 160 may be deposited using, for example, atomic layer deposition (ALD), allowing for a very precise thickness of liner 160. In this manner, a dimension of gate cut isolation opening 162 (e.g., width), can be precisely controlled. Liner 160 may include a low dielectric (low-K) constant material such as but not limited to hydrogenated silicon oxycarbide (SiCOH), porous SiCOH, porous methylsilsesquioxanes (MSQ), porous hydrogensilsesquioxanes (HSQ), octamethylcyclotetrasiloxane (OMCTS) $[(CH_3)_2SiO]_4$ 2.7, or other low-k dielectrics.

Figure 10A:
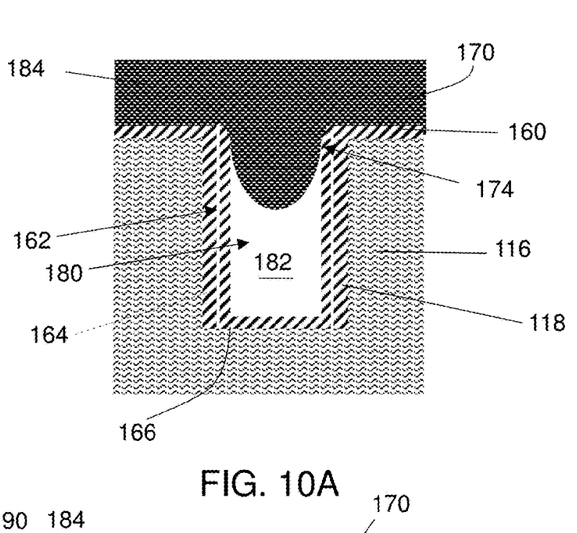
FIGS. 10A-B show cross-sectional views of forming a gate cut isolation including an air gap by sealing an upper end of the gate cut isolation opening according to embodiments of the disclosure.
Figure 10B:
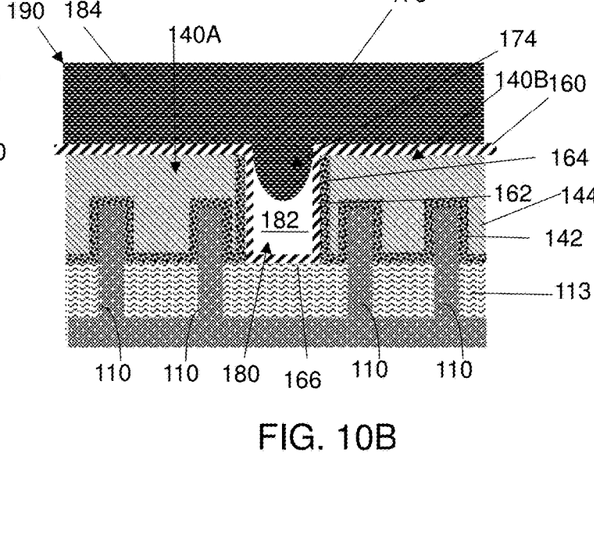

FIGS. 10A-B show cross-sectional views of depositing a sealing layer 170, closing an upper end 174 (FIGS. 9A-B, 10A-B) of gate cut isolation opening 162 (FIGS. 9A-B) and forming a gate cut isolation 180 including an air gap 182. Sealing layer 170 may include any dielectric material capable of closing upper end 174 including but not limited to silicon nitride. Sealing layer 170 may be deposited using, for example, CVD. In contrast to conventional processes that attempt to deposit dielectric in a very small gate cut isolation opening, as shown, sealing layer 170 pinches off upper end 174, creating gate cut isolation 180 with air gap 182. Hence, there is no need to deposit a dielectric all the way into gate cut isolation opening 162, or have to provide potentially damaging overetch processes to remove dummy gate 114 material from bottom portion 166 thereof. Sealing layer 170 also creates a cap 184 outside of gate cut isolation 180. As illustrated, air gap 182 distance between metal gates 140A, 140B, i.e., work function metal 142, is relatively large, which advantageously enlarges space between metal gates 140A, 140B, reducing cross-talk. Air gap 182 also provides a dielectric constant that is superior to any material dielectric currently used to form gate cut isolations.

Figure 11:
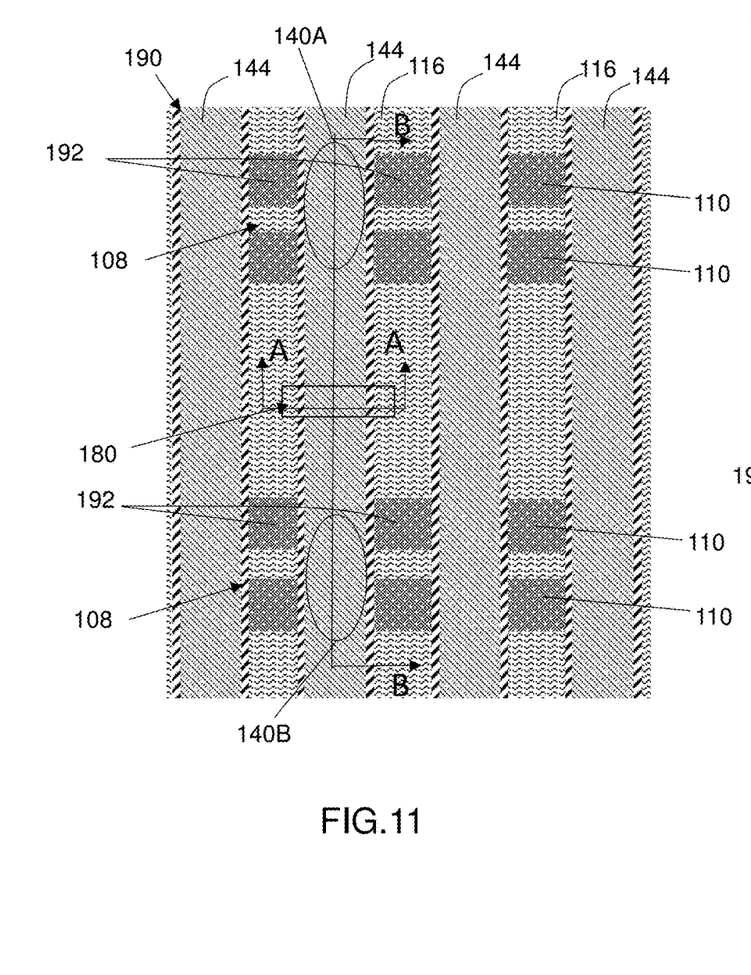
FIG. 11 shows a schematic plan view of an integrated circuit including a gate cut isolation with an air gap according to embodiments of the disclosure.

FIG. 11 shows a schematic plan view of an integrated circuit (IC) 190 including gate cut isolation 180, according to embodiments of the disclosure. FIG. 11 shows the schematic plan view with liner 160 and sealing layer 170 removed, revealing metal gates 140A, 140B, and (buried) active region, e.g., fins 110. IC 190 may include spaced active regions, e.g., semiconductor fins 110, extending from substrate 112 (FIG. 2B). A first gate 140A extends over a first active region, e.g., perpendicularly over at least one of the plurality of spaced semiconductor fins 110 (three as shown). A second gate 140B may extend over a second active region, e.g., perpendicularly over at least one of the plurality of spaced semiconductor fins 110 (three as shown). It is understood that source/drain regions 192 are formed in active regions, e.g., fins 110, to each side of a respective gate to form respective transistors. FIG. 11 and FIG. 10B show gate cut isolation 180 between ends of two gate conductors, i.e., metal gates 140A, 140B, over active regions, i.e., semiconductor fins 110 over substrate 112 (FIG. 2). As shown in FIG. 10B, gate cut isolation 180 includes liner 160 covering sidewalls 164 and bottom portion 166 of gate cut isolation opening 162 between the ends of gate conductors, i.e., metal gates 140A, 140B. Gate cut isolation 180 also includes gate cut isolation opening 162 between first gate 140A, 140B, and liner 160 extending along bottom portion 166 and sidewalls 164 of the opening. Gate cut isolation 180 also includes sealing layer 170 over gate cut isolation opening 162 (FIGS. 9A-B) closing upper end 174 of the opening, and creating air gap 182 in the opening. As noted, liner 160 includes a low-K material, and sealing layer 170 may include, for example, silicon nitride.

As noted, embodiments of the disclosure allow for creation of smaller spacing relative to the ends of the gate conductors, and prevents problems associated with conventional processing such as overetching that can lead to shorts. In contrast to conventional processing, gate gut isolation 180 is formed after the formation of work function metal 142 (and the rest of metal gates 140A, 140B). Consequently, embodiments of the disclosure prevent improper formation of work function metals, e.g., with voids created by the gate cut isolation not leaving sufficient space for proper deposition of the work function metal. In addition, air gap 182 provides a higher dielectric constant than conventional gate cut isolation dielectric materials.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about", "approximately" and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. An integrated circuit (IC), comprising:
    a plurality of spaced first and second active regions in a substrate;
    a first gate extending over the first active region;
    a second gate extending over the second active region; and
    a gate cut isolation separating the first gate from the second gate, the gate cut isolation including:
        a gate cut isolation opening extending into an interlayer dielectric layer, the gate cut isolation opening between the first gate and the second gate,
        a liner extending along a bottom portion and sidewalls of the opening, and
        a sealing layer over the gate cut isolation opening, the sealing layer closing an upper end of the opening, creating an air gap in the opening, wherein the sealing layer extends into the gate cut isolation opening and through a surface of the interlayer dielectric layer.

2. The IC of claim 1, wherein the liner includes a low dielectric constant material.

3. The IC of claim 1, wherein the sealing layer includes silicon nitride.

4. The IC of claim 1, wherein the first gate is recessed.

5. The IC of claim 1, wherein the second gate is recessed.

6. The IC of claim 1, wherein the liner includes a low dielectric constant material.

7. The IC of claim 1, wherein the liner covers the sidewalls and the bottom portion of the opening between the first active region and second active region.

8. The IC of claim 1, wherein the sealing layer includes silicon nitride.

9. The IC of claim 1, further including a cap on an upper layer of the liner.

* * * * *